US005573435A

United States Patent [19]
Grabbe et al.

[11] Patent Number: 5,573,435
[45] Date of Patent: Nov. 12, 1996

[54] TANDEM LOOP CONTACT FOR AN ELECTRICAL CONNECTOR

[75] Inventors: Dimitry G. Grabbe, Middletown; Iosif Korsunsky, Harrisburg, both of Pa.

[73] Assignee: The Whitaker Corporation, Wilmington, Del.

[21] Appl. No.: 521,721

[22] Filed: Aug. 31, 1995

[51] Int. Cl.$^6$ .............................. H01R 4/48; H01R 9/09
[52] U.S. Cl. .............................. 439/862; 439/66; 439/91
[58] Field of Search .............................. 439/66, 71, 91, 439/591, 862; D13/133, 148, 153, 117

[56] References Cited

U.S. PATENT DOCUMENTS

| | | | |
|---|---|---|---|
| 4,511,197 | 4/1985 | Grabbe | 339/17 CF |
| 4,513,353 | 4/1985 | Bakermans et al. | 361/399 |
| 4,647,124 | 3/1987 | Kandybowski | 339/17 CF |
| 4,699,593 | 10/1987 | Grabbe et al. | 439/71 |
| 4,805,885 | 2/1989 | Rose et al. | 267/165 |
| 4,927,369 | 5/1990 | Grabbe et al. | 439/66 |
| 4,995,817 | 2/1991 | Grabbe | 439/71 |
| 5,069,627 | 12/1991 | Buck et al. | 439/66 |
| 5,308,252 | 5/1994 | Mroczkowski et al. | 439/66 |

*Primary Examiner*—Neil Abrams
*Assistant Examiner*—Brian J. Biggi
*Attorney, Agent, or Firm*—Robert J. Kapalka

[57] ABSTRACT

An electrical contact comprises a generally flat contact body having a central member and a pair of compliant sections formed as tandem loops on opposite sides of the central member. Each of the compliant sections has a contact section at an end remote from the central member, and the body is resiliently compressible along an axis of deflection extending through the central member and the contact sections.

6 Claims, 3 Drawing Sheets

TANDEM LOOP CONTACT FOR AN ELECTRICAL CONNECTOR

FIELD OF THE INVENTION

The invention relates to an electrical contact having a tandem loop configuration for use in a connector between electrical interfaces.

BACKGROUND OF THE INVENTION

Electronic packages having leads arranged in a ball grid array (BGA) or a land grid array (LGA) are known. These packages have a relatively low height which is desirable for saving space in electronic assemblies. The packages may be surface mounted directly on a circuit board in a soldering process wherein the leads become solder bonded to a corresponding array of circuit pads on the board. However, solder bonding has the drawback that the package is not easily removable for replacement or upgrade. It is often desirable to provide a connector for mounting the electronic package on the circuit board in a separable fashion. Keeping the connector height low is a major consideration.

Connectors are known for removably mounting a BGA or LGA package on a circuit board. Such connectors are disclosed in U.S. Pat. Nos. 4,511,197; 4,513,353; 4,647,124; and 4,699,593. These connectors comprise a substantially flat dielectric housing which resides between the electronic package and the circuit board. The housing has an array of cavities in which are disposed electrical contacts arranged in correspondence with the array of leads of the electronic package. Each of the contacts has a pair of oppositely extending noses which project beyond external surfaces of the connector housing. When the package is mounted on the connector, each of the contacts has one nose engaged with a respective lead of the package and the other nose engaged with a respective pad on the board. A compressive force is applied to the package and the board to assure firm engagement of each nose with its respective lead or pad. Typically, the compressive force may be applied by pressure plates which are fastened together to sandwich the package, connector and board therebetween.

Considering the circuit board to lie in a horizontal plane, the contacts must be compliant in the vertical direction in order to assure engagement with all of the leads and pads despite any coplanarity mismatch between the package and the board. Further, the contacts, which exert a spring force when compressed, should have a low spring rate to keep normal forces on the leads and pads within a desired range. High compliancy and a low spring rate can be accomplished by contacts which have a long spring length and a small cross-sectional area, but increases in spring length are associated with increases in inductance, and reductions in cross-sectional area are accompanied by increases in electrical resistance, both of which are detrimental to electrical performance.

Accordingly, it is an object of the present invention to provide a contact for an electrical connector which offers high compliancy and a low spring rate along with low electrical resistance and a reduction in self-inductance effects.

SUMMARY OF THE INVENTION

An electrical contact for use in a connector between electrical interfaces comprises a generally flat contact body formed as a monolithic unit, the body having a central member and a pair of compliant sections on opposite sides of the central member. Each of the compliant sections has a contact section at an end remote from the central member, and the body is resiliently compressible along an axis of deflection extending through the central member and the contact sections. Each of the compliant sections extends along a looping course which originates at the central member and terminates at a respective distal end having a convex surface, and the central member has a pair of pockets each with a concave surface which is shaped complementary to the convex surface of a respective one of the distal ends, whereby the distal ends reside in their respective pockets and are held in the central member during deflection of the contact body.

BRIEF DESCRIPTION OF THE DRAWINGS

The invention will now be described by way of example with reference to the accompanying drawings in which like elements in different figures thereof are identified by the same reference numeral and wherein.

DETAILED DESCRIPTION OF THE PREFERRED EMBODIMENT

Figure 1:
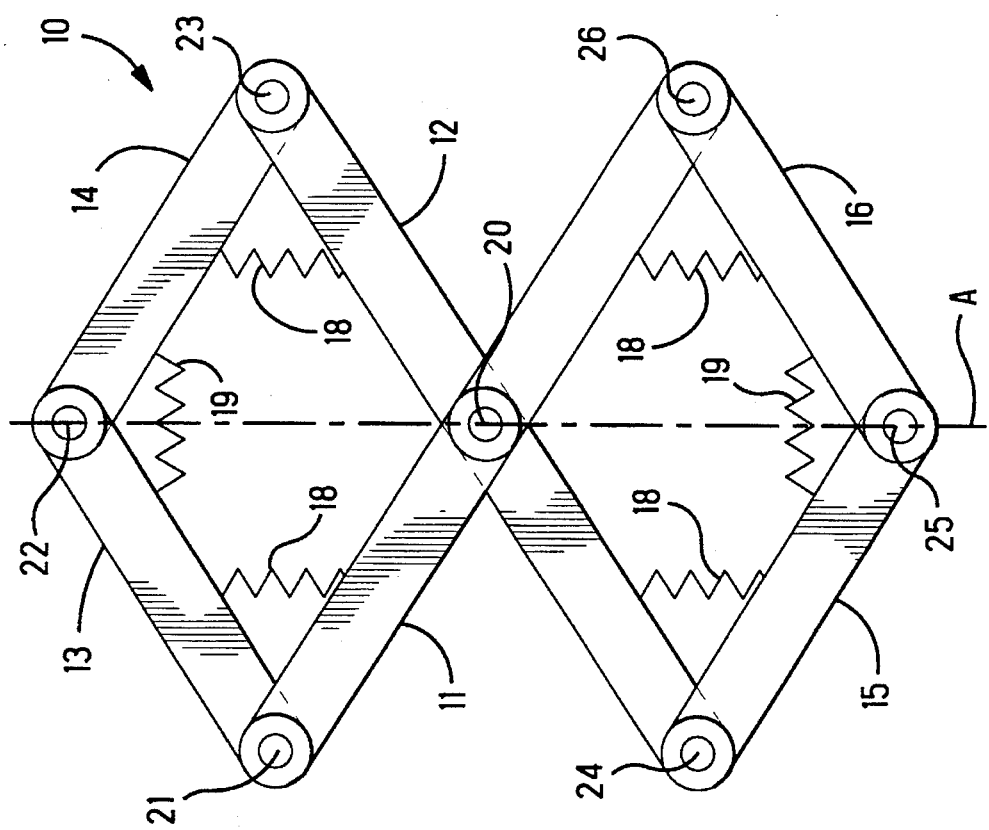
FIG. 1 shows a kinematic linkage model on which the invention is patterned.

An electrical contact according to the invention is patterned on a kinematic linkage model 10 shown in Fig. 1. The linkage model is a simple arrangement of cross bars 11, 12 which are connected by a central pivot pin 20, and links 13, 14, 15, 16 which have ends attached to respective pivot pins 21 thru 26. Compression springs 18 and tension springs 19 resiliently resist compression of the linkage model along its major axis A and maintain the linkage model in equilibrium during periods when it is undeflected by external forces. The springs 18 and 19 can be selected according to their spring characteristics in order to obtain a desired spring rate for the linkage model in the direction of the axis A. This linkage model possesses desirable characteristics for an electrical contact such as relatively high compliancy in a relatively short length, and a dual pathway between opposite ends. The linkage model is converted to a workable shape for a contact in order to retain the desirable characteristics.

Figure 2:
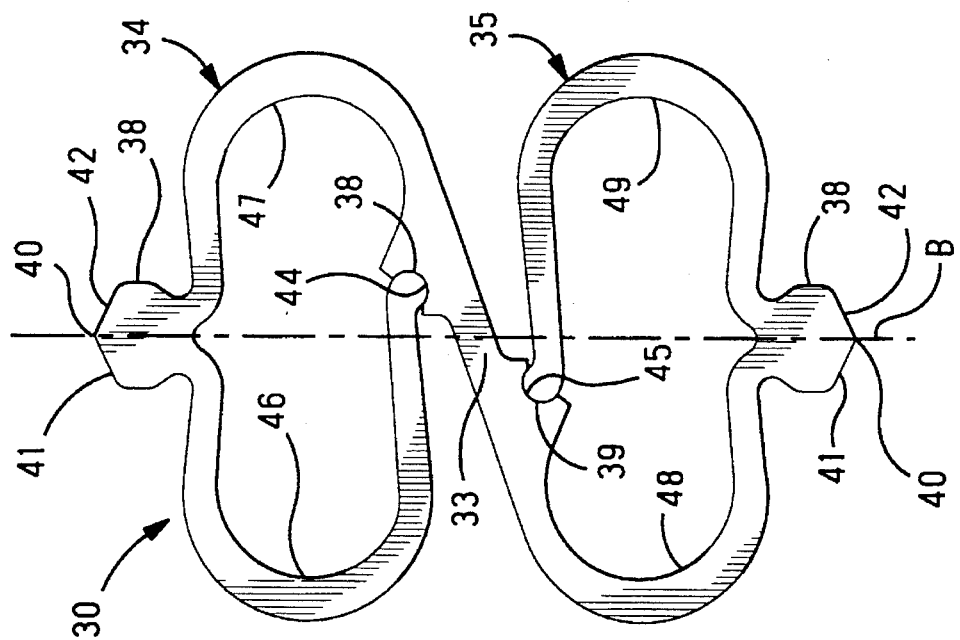
FIG. 2 is a side elevation view of a contact according to the invention.
Figure 3:
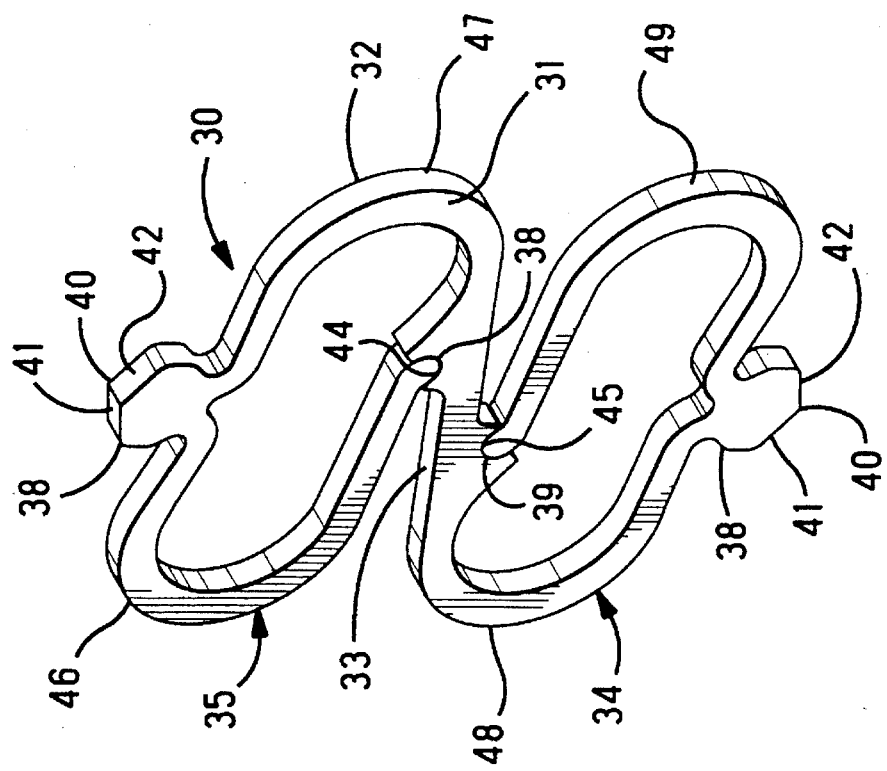
FIG. 3 is an isometric view of the contact.

An electrical contact 30 patterned after the linkage model 10 is shown in FIGS. 2 and 3. The contact 30 is a generally flat body which is stamped from sheet material as a monolithic, i.e., one-piece unit. The contact 30 has opposite side surfaces 31 and 32 which are formed by the side surfaces of the sheet material from which it is stamped. The contact body has a central member 33 and a pair of compliant sections 34, 35 on opposite sides of the central member. Each of the compliant sections 34, 35 has a respective contact section 38 at an end of the compliant section remote from the central member, and the contact sections 38 each have a pronounced tip 40 which is formed by the junction of two angled edges 41, 42.

Figure 4:
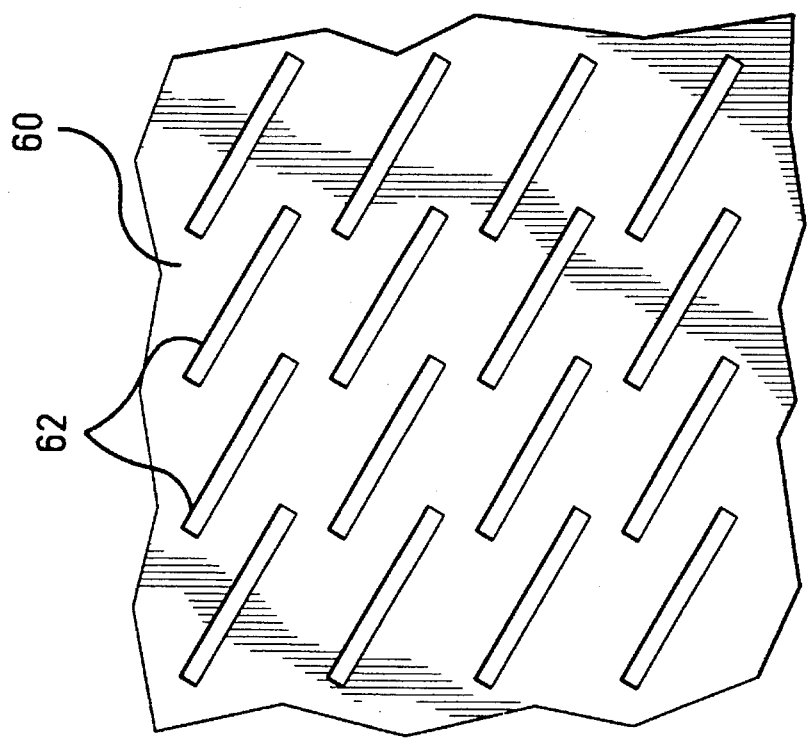
FIG. 4 is a top plan view of a portion of an electrical connector with which the contact can be used.

The contact 30 is resiliently compressible along a deflection axis B which extends through the central member 33 and the pair of contact sections 38. Resiliency of the contact is enhanced by the compliant sections 34, 35 each of which extends along a looping course which originates at the central member 33 and terminates at a respective distal end 38, 39 having a convex surface. Each of the compliant sections 34, 35 includes a pair of U-shaped sections 46, 47 and 48, 49, respectively. Each pair of U-shaped sections are open toward each other on opposite sides of the axis B. The central member 33 has a pair of pockets 44, 45 each with a concave surface which is shaped complementary to the convex surface of a respective one of the distal ends 38, 39. The distal ends 38, 39 reside in the pockets 44, 45 and are held in the central member 33 during deflection of the contact body. In the preferred embodiment shown, the central member 33 extends diagonally across the deflection axis B, and the distal ends 38, 39 are disposed on respective opposite sides of the deflection axis B, The contact 30 is useful in a connector for electrically connecting a first electrical interface, such as leads of an electronic package, to a second electrical interface, such as circuit paths on a circuit board. There is shown in FIG. 4 a top view of a portion of such a connector which includes a connector body 60 made from plastic or other dielectric material having a plurality of contact cavities 62. The cavities 62 are arranged in an array corresponding to the array of leads of the electronic package to be mounted on the connector, Each of the cavities 62 is a rectangular-shaped slot which extends through the connector body 60 from top to bottom thereof. Each of the contacts 30 has a slight bow whereby the contacts 30 are held in their respective cavities 62 by friction but are free to flex within their cavities.

Figure 5:
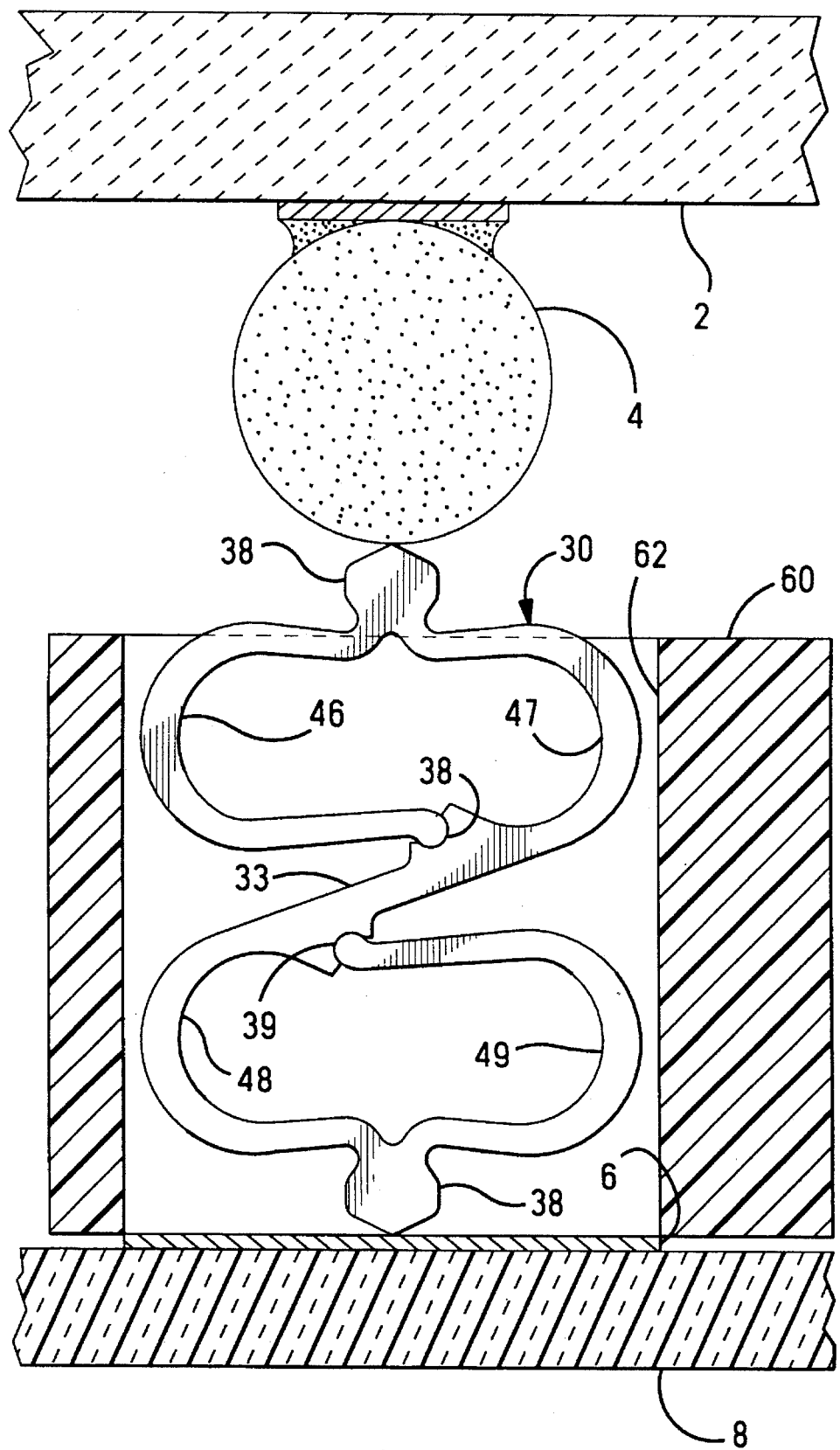
FIG. 5 is a cross-sectional view showing the contact in a connector engaged between an electronic package and a circuit board.

There is shown in FIG. 5 a cross-sectional view showing a representative contact in a connector which serves to electrically connect an electronic package 2 to a circuit board 8. The package 2 has electrical leads each in the form of a solder ball 4, the leads being disposed in a standardized array over a face of the package. Instead of solder balls 4, the package 2 could have an array of contact pads similar to pad 6 which is a terminal for an electrical trace on circuit board 8, the present invention being engageable with either ball or pad type leads. The leads on the package 2 may be urged into engagement with the array of contacts in the connector such as by pressure plates (not shown) arranged above the package 2 and below the circuit board 8 and secured together with threaded fasteners, thereby sandwiching the package 2, the connector and the circuit board 8 therebetween.

If the contact 30 is gold plated, it ordinarily picks up a small amount of tin from the solder ball 4 on the first engagement with the solder ball. Upon separation of the electronic package, this extremely thin layer of tin oxidizes, and may be fully converted to oxide, or some other film, depending on the presence of surrounding gas components. Therefore, the metallurgy must be such that the contact surface has either none or very poor solubility with tin. Materials such as nickel-boron and some stainless steels have poor affinity for tin and are therefore good candidates for the contact material. In addition, contact tips could be sputtered with materials such as platinum or titanium nitride or others, to prevent wetting by solder.

A contact according to the invention has a number of advantages. Tandem compliant loop sections provide high compliancy and also provide two parallel electrical paths for low resistance and low self-inductance. The effective self-inductance of this contact is approximately one-half of the self-inductance of a straight wire having the same point-to-point length. Further, the contact tips are made from materials which resist formation of an oxide film.

The invention having been disclosed, a number of variations will now become apparent to those skilled in the art. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

We claim:

1. An electrical contact for use in a connector between electrical interfaces comprising:

a generally flat contact body formed as a monolithic unit, the body having a central member and a pair of compliant sections on opposite sides of the central member, each of the compliant sections having a contact section at an end remote from the central member, the body being resiliently compressible along an axis of deflection extending through the central member and the contact sections, each of the compliant sections extending along a looping course which originates at the central member and terminates at a respective distal end having a convex surface, the central member having a pair of pockets each with a concave surface which is shaped complementary to the convex surface of a respective one of the distal ends, the distal ends residing in their respective pockets and being held in the central member during deflection of the contact body.

2. The contact according to claim 1, wherein the central member extends diagonally across the deflection axis.

3. The contact according to claim 2, wherein the distal ends are disposed on respective opposite sides of the deflection axis.

4. An electrical contact for use in a connector between electrical interfaces, comprising:

a generally flat contact body formed as a monolithic unit having a pair of contact sections at opposite ends and being resiliently compressible along an axis of deflection extending through the contact sections, the body including a pair of compliant sections disposed on opposite sides of a central member each of the compliant sections extending along a looping course which originates at the central member and terminates at a respective distal end with a convex surface, each of the compliant sections including a pair of U-shaped sections disposed on opposite sides of the axis and being open toward each other, each of the contact sections being at a junction of a respective one of the pairs of U-shaped sections, the central member having a pair of pockets each with a concave surface which is shaped complementary to the convex surface of a respective one of the distal ends, the distal ends residing in the pockets and being held in the central member during deflection of the contact body.

5. The contact according to claim 4, wherein the central member extends diagonally across the deflection axis.

6. The contact according to claim 5, wherein the distal ends are disposed on respective opposite sides of the deflection axis.

* * * * *